United States Patent [19]

Toppeto

[11] 4,263,549
[45] Apr. 21, 1981

[54] APPARATUS FOR DETERMINING DIFFERENTIAL MODE AND COMMON MODE NOISE

[75] Inventor: Alphonse A. Toppeto, Grayslake, Ill.

[73] Assignee: Corcom, Inc., Libertyville, Ill.

[21] Appl. No.: 84,140

[22] Filed: Oct. 12, 1979

[51] Int. Cl.³ .......................... G01R 1/20; H01F 17/06
[52] U.S. Cl. .................................. 324/127; 324/57 N; 336/176; 336/223
[58] Field of Search .................... 324/127, 129, 117 R, 324/117 H, 57 N; 336/175, 176, 174, 223; 333/12, 25; 455/67

[56] References Cited

U.S. PATENT DOCUMENTS 3,783,415  1/1974  Koskinen ........................ 333/25

FOREIGN PATENT DOCUMENTS 612292  6/1978  U.S.S.R. .................. 324/127

Primary Examiner—Ernest F. Karlsen
Attorney, Agent, or Firm—McCaleb, Lucas & Brugman

[57] ABSTRACT

Apparatus for isolating common mode and differential mode radio frequency noise in electronic and digital equipment from each other and quantitatively determining or displaying each for conformity to standard and for correction. The apparatus is likewise capable of determining and displaying the total of the two modes of noise.

9 Claims, 7 Drawing Figures

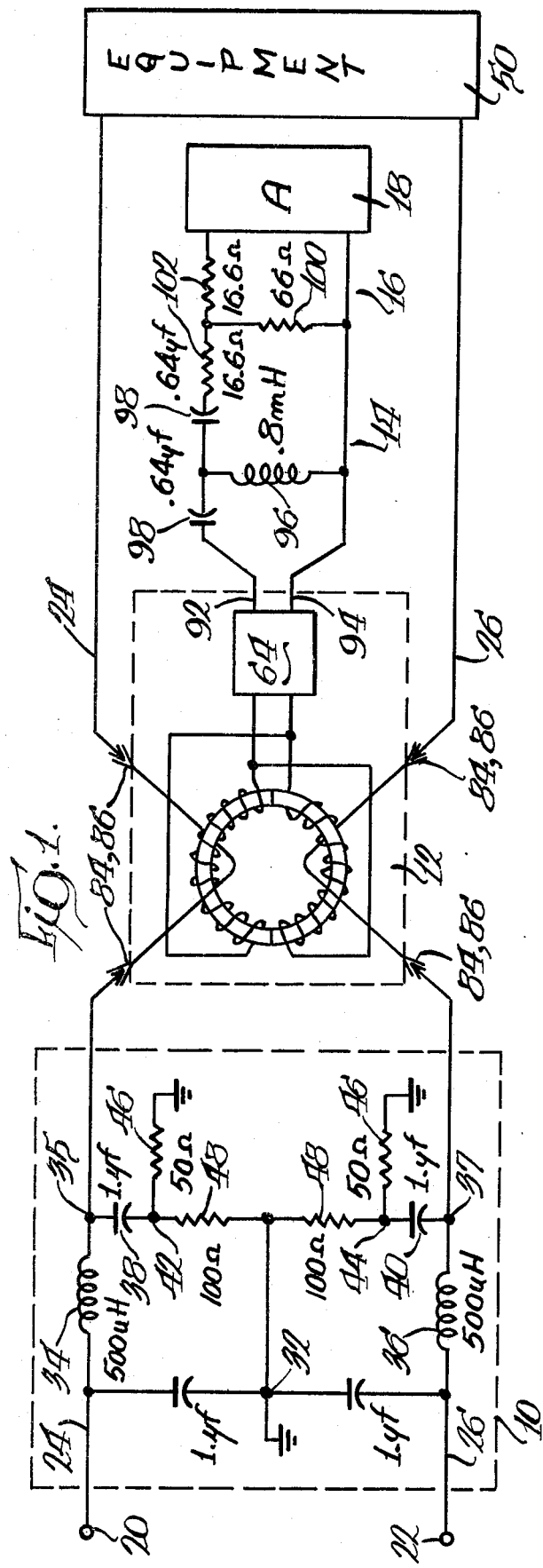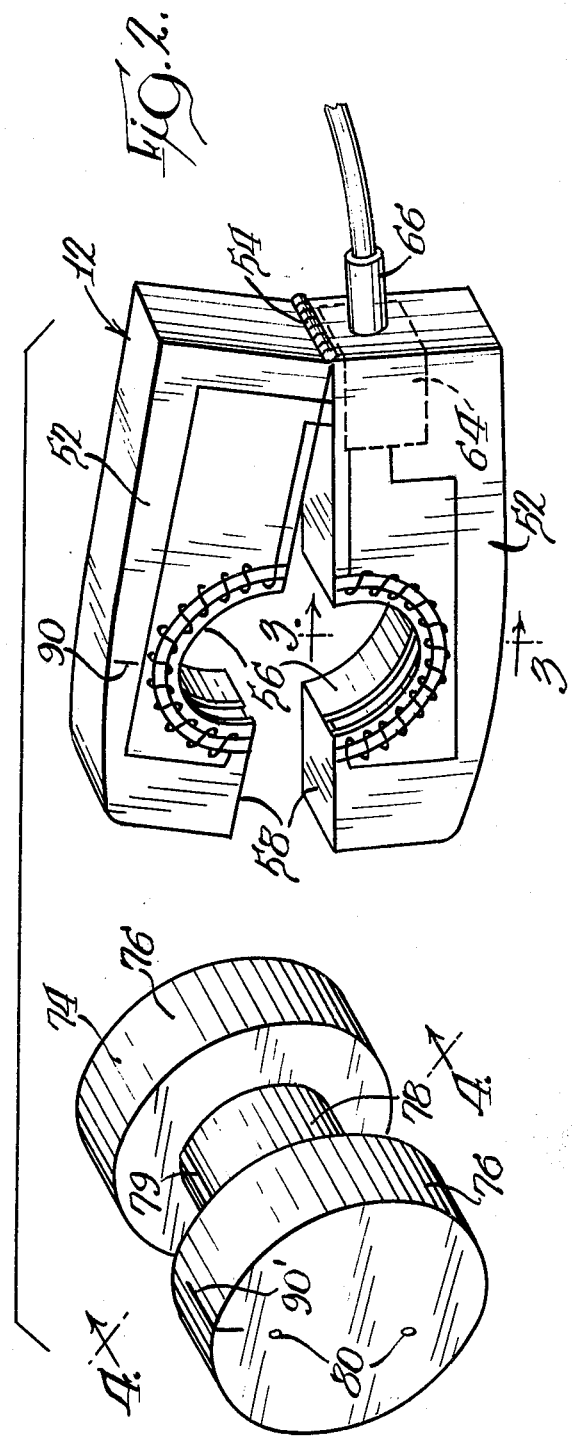

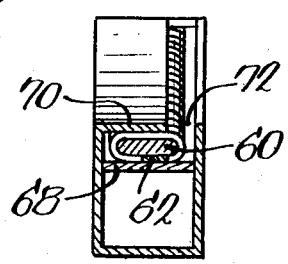
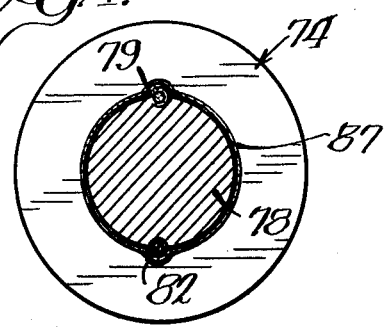
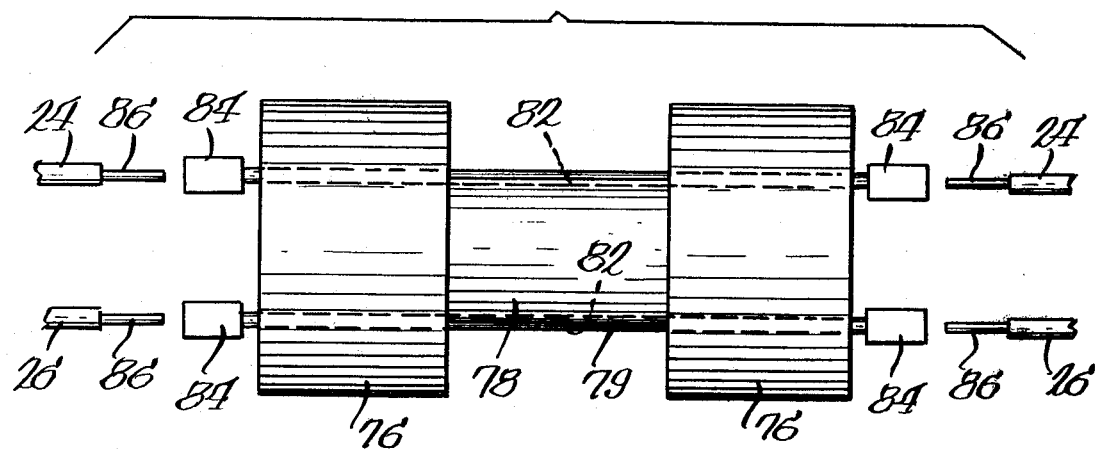
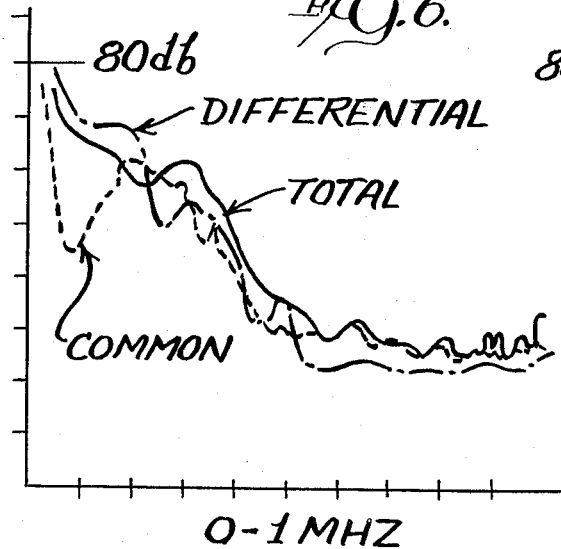
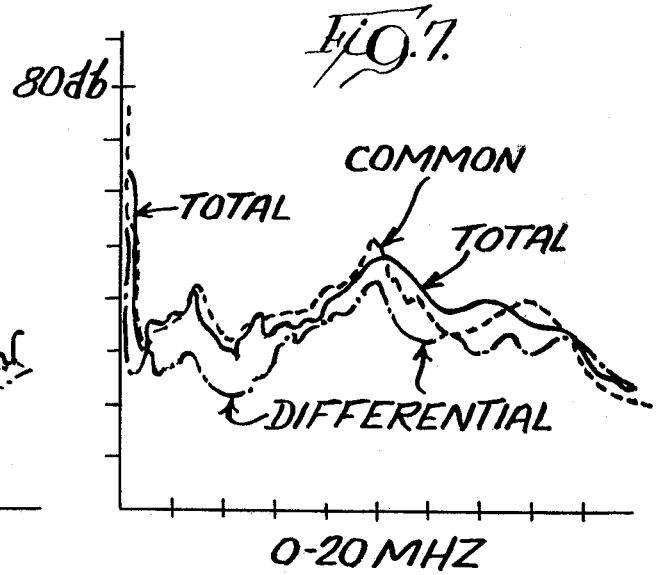

APPARATUS FOR DETERMINING DIFFERENTIAL MODE AND COMMON MODE NOISE

BACKGROUND OF THE INVENTION

Digital and electronic equipment is frequently subject to malfunction in the presence of radio frequency interference in the power line supplying it. Such equipment is not only susceptible to such interference; it is also often highly productive of it and thus may feed out interference through the power lines to other susceptible apparatus. Filters must therefore be interposed between the power source and the equipment to screen out such interference from the equipment and also interference generated by the equipment from returning to the power line.

This interference is analyzable into two sorts of distortion of the power current wave form: common mode interference where identical wave forms in reference to ground appear on the power lines connected to the equipment, and differential mode interference which appears as a voltage difference between the two power lines.

Circuitry exists to filter out radio frequency interference, but for optimum effectiveness and cost, it has been found necessary to treat the two sorts of interference independently. One configuration of filter elements with certain value relationships is optimal for common mode noise e.g., low value capacitors and high value inductance, whereas a different configuration with different value relationships, low value inductance and high value capacitance, is optimal for differential mode noise. Such filter elements can be combined in a single package, but the distinction of function remains. It is important, therefore, that the two noises be separately and accurately assessed, both for filter design and for monitoring filter effectiveness.

One past approach to the isolation of the two modes of noise and the quantitative expression thereof has involved power splitter/combiners. The idea of that approach, as in the present invention, is to bring about a cancellation of one noise mode while augmenting the other. To restate the difference between the two noise modes: noise in each of a pair of power lines is analyzable into a component which is of identical wave form or equal instantaneous voltage in reference to ground to that in the other power line; and into another component which is opposite in wave form or instantaneous voltage to that in the other power line. A zero degree splitter/combiner is used in its combining function to sample the r-f voltages present in the two lines and combine these signals. This, in theory, should result in cancellation of the differential mode noise and a doubling of the common mode noise which then can be projected on a spectrum analyzer for example. For the detection of differential mode noise, a 180 degree splitter/combiner is employed which, again in theory, should result in cancellation of the common mode noise and a doubling of the differential mode noise.

One difficulty with the use of splitter/combiners for this purpose lies in the fact that the 180-degree splitter/combiner relies on passive elements for its operation, and phase displacements do not reach the theoretical (and necessary) full 180-degrees for cancellation of the unwanted noise component. Similarly, a precise zero-degree phase shift over a wide band of frequencies is not achieved by a zero-degree splitter/combiner.

SUMMARY OF THE INVENTION

The present invention contemplates the use of a RFI/EMI current probe of the type involving a split toroidal transformer adapted to encircle a conductor. A novel barbell-shaped shielding element, adapted to have power lines extended through it, is fitted to the probe aperture to expose the power lines in a precise fashion to the transformer core and otherwise shield them so that only the exposed protions of the lines will couple to the probe without coupling to one another. The secondary of the transformer is connected through a high pass filter and an attenuator to a spectrum analyzer where the amplitude of noise can be read over the spectrum of interest.

When the power lines are directed through the barbell in a fashion to generate aiding fluxes in the transformer core with respect to common mode noise, the fluxes generated by the differential mode noise will cancel each other and common mode noise only will appear on the spectrum analyzer. By reversing one of the power lines through the barbell, common mode noise will cancel and only differential mode noise will appear. If a single conductor only is extended through the barbell, the total of both common mode and differential mode noise will appear.

BRIEF DESCRIPTION OF THE DRAWINGS

FIG. 1 is a schematic diagram of a circuit embodying the present invention;

FIG. 2 is an isometric view of the probe and the associated barbell accessory constituting part of this invention;

FIG. 3 is a section through the probe of FIG. 2 taken substantially along line 3—3 of FIG. 2, looking in the directions of the arrows;

FIG. 4 is a section through the barbell of FIG. 2 taken along line 4—4 of FIG. 2, looking in the direction of the arrows;

FIG. 5 is a side elevation of the barbell of FIG. 2 showing the conductors associated therewith and terminal fittings whereby power connections are made and reversed;

FIG. 6 is a representation of the envelope of a spectrum analyzer display, derived from the apparatus of the present invention, over the range of from 0 to 1 megahertz; and FIG. 7 is a representation similar to FIG. 6 showing the envelope display over the range of from 0 to 20 megahertz.

DESCRIPTION OF A PREFERRED EMBODIMENT

FIG. 1 illustrates a circuit incorporating the apparatus of this invention for testing a piece of electronic equipment for emitted RFI. The circuit may be divided into sections: a line impedance stablizing network 10 (LISN), the probe 12, a high pass filter 14, an attenuator 16, and a spectrum analyzer 18.

The LISN includes terminals 20 and 22 adapted for connection to an ordinary 120 or 240 volt, two wire power source, either AC or DC. Lines 24 and 26 are connected respectively to terminals 20 and 22. Capacitors 28 and 30 connect lines 24 and 26 to a ground terminal 32. Lines 24 and 26 respectively contain low value inductors 34 and 36. On the remote side of the inductors, lines 24 and 26 are connected from terminals 35 and 37 through capicitors 38 and 40 to terminals 42 and 44. Terminals 42 and 44 are also connected through resistors 48 to the ground terminal 32. These terminals are impressed with the RFI voltage and connection is made to them by such noise detection techniques as the use of a splitter/combiner as described above. RFI appears virtually free of the power frequency. For the present application, however, terminals 42 and 44 are each connected to ground over resistors 46. Lines 24 and 26 then continue from terminals 35 and 37 through the probe 12 to the equipment 50 being tested.

The LISN serves to normalize the impedance of the power source at the vicinity of 3 ohms for power frequencies scaling up to about 150 ohms at radio frequencies. It also serves to reduce or filter out RFI in the power input so as to restrict the testing to noise generated only within the equipment under test.

The apparatus of this invention is capable of being applied directly to power lines without the intervention of the LISN. In such case, however, the noise detected by the probe will be the sum of the noises present in the equipment plus any noise which might be present in the power line. Consequently, line impedance variations may affect the quantitative accuracy and reproductability of the readings.

The probe 12 employed in the illustrated embodiment is a RFI/EMI current probe, such as model 6741-1, manufactured by Solar Electronics Company, Hollywood, Cal. The probe 12 is particularly illustrated in FIGS. 2 and 3. It consists of two generally rectilinear, thin housings 52, hinged together along one narrow edge 54 and having facing, semi-circular openings or notches 56 in opposing long edges 58 of the housings. Interiorly, the two housings have semi-circular cores 60 with windings 62 thereon conforming to and fitted in the semi-circular openings 56. (see FIG. 3) The windings 62 are connected in parallel and extend to passive circuitry indicated generally at 64; the output of which is arranged for external connection as at 66. The windings 62 on the cores 60 constitute the secondary of a toroidal transformer of which power conductors 24 and 26 contained in the circular aperture or probe window, defined by the mated openings 56 when the legs 52 of the probe are closed, constitute the primary. Interiorly of the housings or legs, core 60 and associated windings 62 are supported by a shelf 68 immediately adjacent to its associated circular opening or notch 56. A ferro magnetic shield 70 extends a major part of the way across each opening 56, but leaves a gap 72 adjacent one side of the housing for the flow of magnetic flux to the transformer 60, 62.

The passive circuitry 64 provides essentially flat transfer impedance characteristics from 10 KHz to 30 MHz, which is the range of concern in the assessment of radio frequency interference, and sharply attenuates the frequencies downwardly therefrom.

The probe 12 is provided with a novel barbell 74, illustrated particularly in FIGS. 2, 4 and 5. The barbell preferably is of copper and spool shaped and has two enlarged head end sections 76 approximately 2 inches in diameter separated by a smaller cylindrical center section 78, about one inch in diameter. The inside diameter of the window of the probe is approximately one and one quarter inches. The length of the center section is about 1½ inches, slightly greater than the thickness of the probe. Holes 80 are drilled lengthwise through the barbell, 180-degrees apart with reference to the center thereof, to intercept the external surface of the center section 78 and form semi-circular channels or passageway means 79 thereacross. The holes and channels are of a diameter to accommodate lengths of wire 82, such as rubber insulated 18 AWG stranded wire, which pass through the holes and along the channels (see FIG. 5). The ends of wires 82 are fitted with connectors 84, here, banana jacks, as close to the barbell as connection can be made, to anchor the wires 82 to the barbell. The output lines of the LISN and the input lines of the equipment are provided with cooperating jacks 86 for connection to the wires 82 and jacks 84.

With the wires 82 in place in the channels 79, the diameter of the central portion of the barbell is built up by wrapping it with layers of insulating tape 87 so it will fit snugly within the circular aperture or window of the probe when the latter is closed (see FIGS. 2 and 4).

The barbell 74 and the probe housing 52 may be provided with alignable scribe lines 90, 90'; one on the side of one of the housings 52 and one on the periphery of one of the enlarged end parts 76 of the barbell 74. Preferably, such scribe lines are coincident with the plane of the wires 82 so as to position the plane passing through the wires 82 perpendicular to the plane dividing the toroidal core halves. The effect, of course, is to provide a placement of the transformer primary (the two wires 82) in reference to the core and secondary winding of the transformer which is precisely produceable from measurement to measurement. This exact location of the primary may involve a excess of caution, since it has been found that adequate results usually are obtainable from the particular probe described even if the primary is deviated from the above described precise positioning. As a matter of fact, the wires 82 need not be exactly 180-degrees apart as long as they each confront a different core half. However, with a less precisely made probe the scribe lines provide an easy and cheap expedient to insure reproduceable results.

The secondary output 66 of the probe 12 is connected to lines 92 and 94 which extend through the high pass filter 14, provided to eliminate from the signal delivered to the spectrum analyzer, any excitation attributable to the power frequency. The preferred illustrated filter consists of a 0.8 mH inductor 96 spanning lines 92 and 94 and a pair of 0.64 uF capacitors 98 in line 92 on either side of inductor 96. This filter has a cut-off frequency below 10 kHz and serves with the circuitry 64 of the probe to block the high amplitude line frequencies from the analyzer 18, which might otherwise overload.

The output of the probe 12 is designed by the manufacturer to be an accurate reflection of the voltage present in a wire it is encircling. Since both of the power lines 24 and 26 are extended through the probe for either noise mode and the particular noise mode in question is doubled while the other noise mode is cancelled, it is necessary to introduce the attenuator section 16 to drop the determined noise by 50%. The attenuator 16 consists simply of three resistors 100 and 102, 102; resistor 100 being in the order of 66 OHMS and the resistor 102 on the order of 16.6 OHMS. The resistor 100 spans the lines 92 and 94 and the resistors 102 are situated in series in line 92 on either side of resistor 100.

After the attentuator 16, the lines 92 and 94 connect to the spectrum analyzer 18. The particular analyzer employed in the illustrated embodiment is a Hewlett-Packard, Model 141T with an 8553B r-f section and an 8552A i-f section.

All conductors are shielded except the conductors 82 which pass through the barbell 74 and transformer. The end sections 76 of the barbell provide shielding for the portions of the wire 82 which are away from the center section 78 in direct confrontation with the transformer core within the probe 12.

As stated above, the output of the probe is designed to determine total noise in the system by encircling either one of the wires 24 or 26. This is achieved by connecting the banana plugs 86 of either one of these wires to one of the wires 82 extending through the copper barbell.

When the two noise modes are to be distinguished, two different connections are made. As shown in FIG. 5, for instance, one noise mode is determined by joining the power input sides of the conductors 24 and 26 to the left hand side of the barbell-contained conductors 82 and the equipment end of the conductors 24 and 26 to the corresponding right hand ends of said conductors 82. The other noise mode is determined by reversing one of the line conductors 24 or 26 with respect to its associated conductor 82, leaving the other of the line conductors as first described. For example, the equipment on the right hand side of conductor 26 is joined to the left hand end of the lower conductor 82 in FIG. 5 and the left hand power side of conductor 26 is then connected to the right hand end of the lower conductor 82, reversing the arrangement shown in FIG. 5.

From the very nature of the two individual modes of noise, with the passage of the two wires through the probe, it will be apparent that with one of the circuit arrangements described above, one of the noise modes will establish bucking or opposing flux fields in the transformer core 62 and the other noise mode will establish aiding fluxes within the core. Thus the noise generating opposing fluxes is essentially cancelled out of the secondary output of the probe and the noise mode which creates the aiding fluxes will appear as twice its actual value. Reversal of one of the lines 24 or 26 with respect to its probe conductor 82, as described above, will result in a reversal of such canceling or aiding relationship.

Turning now to the test results demonstrative of the working features of this invention, attention is directed to FIGS. 6 and 7.

As shown in each of these figures, total noise is depicted by the solid line curve, common mode noise by the dash line curve and differential mode noise by the dot-dash line curve. The vertical scale is represented in decibel equivalents to the measured current while the horizontal scale indicates noise frequencies, over the respective ranges set out in the two figures.

The illustrated test results were obtained by applying the herein taught methology to a 120 volt, 4.6 ampere switching power supply. The 6 dB attenuator was removed when observing total noise so that all scales are identical. The noise level of the spectrum analyzer system was observed to be about 22 dB above a microampere on the scale of FIGS. 6 and 7 and each curve was recorded using a 10 kHz bandwidth in the analyzer.

It will be observed that this particular tested power supply generated more differential than common mode noise below 200 kHz. From 250–350 kHz, common mode noise is greater than differential mode noise while from 350–500 kHz the two noise modes are comparable. Above 500 kHz both noise modes are relatively low except for occasional peaks in each at various frequencies.

Having thus described this invention it is believed that those of normal skill in the art will readily recognize its merit and novel advancement over the prior art. Further, while the invention has herein been described in relation to a particular preferred embodiment, it is susceptible to obvious modification and substitution of equivalents without departing from its inventive teachings.

The embodiments of the invention in which an exclusive property or privilege is claimed are defined as follows:

1. An accessory for a split toroidal r-f current probe of the type having a current sensing aperture, for use in the discrimination and measurement of common mode and differential mode noise, which comprises: a non-ferrous metallic barbell having a central portion of a length and cross-section to fit closely within the probe aperture and larger end portions to overlap the ends of said aperture, passageway means on opposite sides of said central portion and parallel to the central axis thereof to seat lengths of insulated wire therein and provided with holes meeting the ends of said passageway means and extending through said larger end portions for the passage of said wire.

2. The combination of claim 1, wherein said passageways are approximately semi-circular in cross sections.

3. The combination of claim 1, wherein said holes are straight parallel openings through said end portions.

4. The combination of claim 1, wherein said aperture is circular and said central portion is cylindrical and of a cross-sectional diameter to closely fit within the circumference of said aperture.

5. Apparatus for determining differential and common mode r-f noise in electronic equipment, comprising: a pair of power lines connected between a source of power and an item of equipment, a split toroidal r-f current path probe having current sensing aperture means containing portions of said power lines to constitute the primary of the probe, non-ferrous metal shielding means having a central portion fitted closely in said aperture means and having means on the surface thereof to support said power line portions adjacent the periphery of said aperture means in substantial spaced relation from each other and each confronting a different half sector of said toroid whereby to expose said toroid to the flux fields of said portions; non-ferrous metal shielding means wholly and separately enclosing additional portions of said lines extending from said aperture means to points outwardly therefrom, a secondary output from said current probe, means for eliminating secondary current attributable to frequencies from said secondary output, means for displaying the r-f noise derived in the secondary of said probe from the vector sum of the noises in the primary, and means to calibrate said displaying means.

6. The apparatus of claim 5, wherein said shielding means contain separated openings receptive of insulated portions of said power line.

7. The apparatus of claim 5, and connector means associated with said power lines and line portions for selectively coupling said portions to generate aiding and opposing flux fields in said probe, whereby to differentiate common and differential mode noise.

8. The apparatus of claim 5, and means for isolating either of said power line portions from the power source whereby to determine total noise.

9. The apparatus of claim 5, and means for aligning said power line portions in a plane at right angles to the line of division between the half sectors of said toroid.

* * * * *